United States Patent [19]

Dempsey et al.

[11] 4,267,533

[45] May 12, 1981

[54] ACOUSTIC SURFACE WAVE DEVICE

[75] Inventors: Martin E. Dempsey, Acton; Ching W. Lee, Lexington, both of Mass.

[73] Assignee: GTE Laboratories Incorporated, Waltham, Mass.

[21] Appl. No.: 117,707

[22] Filed: Feb. 1, 1980

[51] Int. Cl.³ .................... H03H 9/42; H03H 9/145; H03H 9/64
[52] U.S. Cl. .......................... 333/151; 310/313 B; 333/154; 333/194
[58] Field of Search .................... 333/150–155, 333/193–196; 331/107 A; 310/313 R, 313 A, 313 B, 313 C, 313 D

[56] References Cited

U.S. PATENT DOCUMENTS

| | | | |
|---|---|---|---|
| 3,866,154 | 2/1975 | Moore | 333/154 |
| 4,087,714 | 5/1978 | La Rosa et al. | 310/313 B |
| 4,200,849 | 4/1980 | Malocha | 333/196 X |

OTHER PUBLICATIONS

Hartmann et al.–"Wideband Unidirectional Interdigital Surface Wave Transducers", IEEE Trans. Sonics and Ultrasonics, SU-9, No. 3, Jul. 1972, pp. 378-381.
Rosenfeld et al.–"Unidirectional Acoustic Surface Wave Filters with 2 DB Insertion Loss", IEEE Ultrasonics Symposium Proceedings, Cat. No. 74 CHO 896-ISU, 1974, pp. 425-428.
Toda et al.–"Surface-Wave Devices Using Three-Phase Interdigital Transducers", Ferroelectrics, vol. 9, pp. 33-37.
Malocha–"Quadrature 3 Phase Unidirectional Transducer", IEEE Trans. Sonics and Ultrasonics, SU-26, No. 4., Jul. 1979, pp. 212-215.
Yamanouchi et al.–"Low Insertion Loss Acoustic Surface Wave Filter Using Group-Type Unidirectional Interdigital Transducer", IEEE Ultrasonics Symposium Proc., Cat No. 75 CHO 994-4SU, 1975, pp. 317-321.

Primary Examiner—Marvin L. Nussbaum
Attorney, Agent, or Firm—David M. Keay

[57] ABSTRACT

An acoustic surface wave device including a three-phase unidirectional transducer. The transducer has three sets of interdigitated electrodes. The first and second sets of electrodes are each connected to bus bars, one on each side of the central axis of the transducer. The electrodes of the third set are connected to two bus bars one on each side of the central axis. The structure of the third set of electrodes and the bus bars connected thereto is symmetrical with respect to the central axis. The balanced structure of the transducer permits simplified impedance-matching and phase-shifting networks for enabling three-phase unidirectional operation of the transducer from a single phase electrical source.

9 Claims, 2 Drawing Figures

4,267,533

ACOUSTIC SURFACE WAVE DEVICE

BACKGROUND OF THE INVENTION

This invention relates to acoustic surface wave devices. More particularly, it is concerned with acoustic surface wave devices including a three-phase unidirectional transducer.

Three-phase acoustic surface wave transducers which propagate acoustic waves along the surface of a propagating medium in only one direction have been developed. These unidirectional transducers employ three sets of electrodes. A single phase source of electrical signals is coupled to the three sets of electrodes through impedance-matching and phase-shifting networks so that the three sets of electrodes are activated in the proper phase relationships to generate acoustic surface waves which propagate in one direction only. With three-phase unidirectional transducers heretofore available complicated networks for impedance-matching and phase-shifting have been required thus limiting the applications in which the devices may be economically employed.

SUMMARY OF THE INVENTION

An improved acoustic surface wave device in accordance with the present invention includes an acoustic surface wave propagating medium with a transducer disposed on the surface of the medium. The transducer includes first, second, and third sets of interdigitated electrodes of conductive material on the surface of the propagating medium with the electrodes extending generally transversely to the central axis of the transducer. A first bus bar of conductive material is disposed on one side of the central axis and extends generally along the direction of the central axis. The first bus bar is connected to the end of each electrode of the first set on the one side of the central axis. A second bus bar of conductive material is disposed on the other side of the central axis and extends generally along the direction of the central axis. The second bus bar is connected to the end of each electrode of the second set on the other side of the central axis. A third bus bar of conductive material is disposed on the one side of the central axis and extends generally along the direction of the central axis. The third bus bar is connected to the end of each electrode of the third set on the one side of the central axis. A fourth bus bar of conductive material is disposed on the other side of the central axis and extends generally along the direction of the central axis. The fourth bus bar is connected to the end of each electrode of the third set on the other side of the central axis. The electrodes of each set and the bus bars connected thereto are electrically isolated from the electrodes of the other sets and the bus bars connected thereto.

A transducer in accordance with the present invention having third and fourth bus bars connected to the opposite ends of the electrodes of the third set provides a balanced structure thus permitting simplified impedance-matching and phase-shifting networks which enable balanced three-phase unidirectional operation of the transducer from a single phase electrical source.

BRIEF DESCRIPTION OF THE DRAWINGS

In the drawings:

It should be noted that FIG. 1 is a representation and FIG. 2 is a schematic diagram, and thus the figures do not show precisely the actual configuration, spacing, or number of electrodes as present in actual devices.

For a better understanding of the present invention, together with other and further objects, advantages, and capabilities thereof, reference is made to the following disclosure and appended claims in connection with the above described drawings.

DETAILED DESCRIPTION OF THE INVENTION

Figure 1:
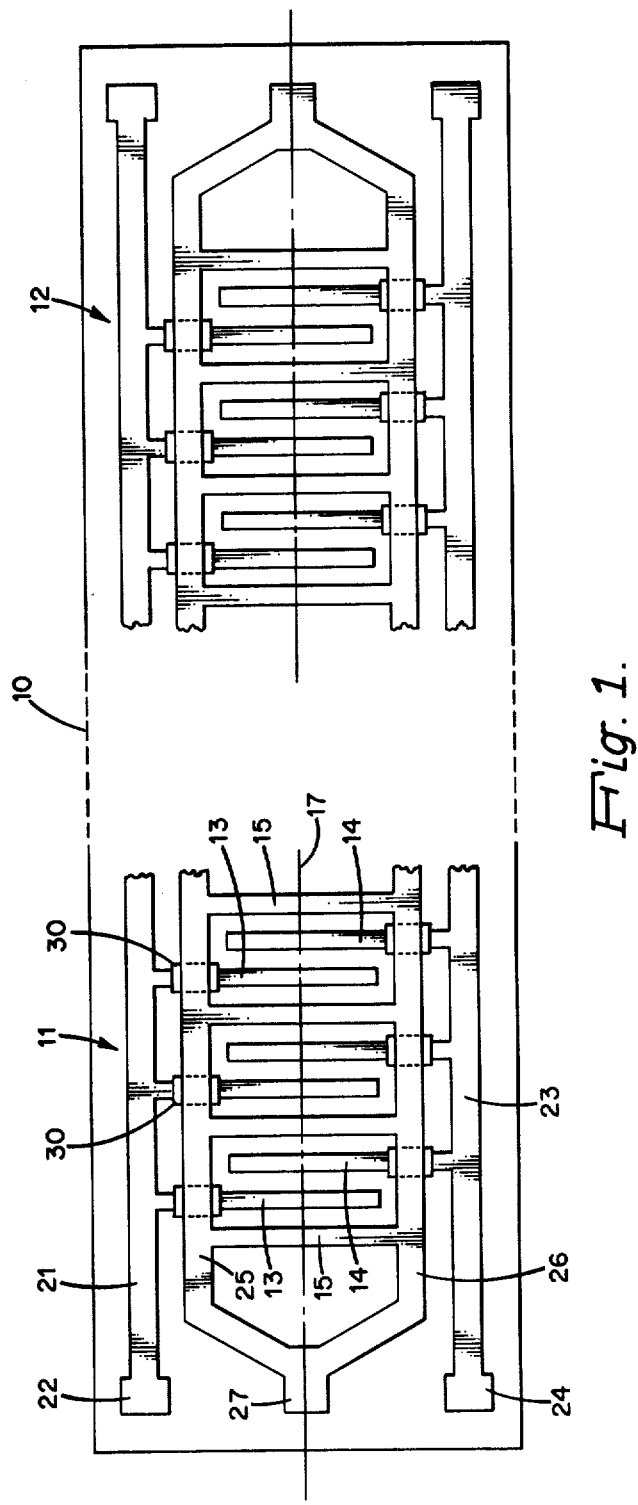
FIG. 1 is a plan view representing portions of an acoustic surface wave device in accordance with the present invention.

FIG. 1 is a representation of an acoustic surface wave device in accordance with the present invention. The device includes a substrate 10 of a suitable acoustic surface wave propagating material, for example, PZT, lithium niobate, or lithium tantalate. An input or transmitting transducer 11 of conductive material is deposited on the surface of the substrate 10 for launching acoustic surface waves along a propagation path in the substrate. An output or receiving transducer 12 which is similar to the input transducer 11 is located across the propagation path spaced from the transmitting transducer in order to receive acoustic surface waves generated by the input transducer.

The input transducer 11 includes three sets of interdigitated conductive electrodes 13, 14 and 15 deposited on the surface of the substrate of wave propagating material 10. Each of the electrodes is an elongated member extending transversely to the propagation path of acoustic surface waves in the propagating material and to the central axis 17 of the transducer. The ends of the electrodes 13 of the first set which lie on one side of the central axis 17 are connected to a bus bar 21. The bus bar 21 is a strip of conductive material extending generally along the direction and parallel to the central axis 17. The bus bar 21 terminates in a connection pad 22 to which an electrical connection can be made.

The ends of the electrodes 14 of the second set which lie on the opposite side of the central axis 17 are connected to a bus bar 23. Bus bar 23 is a strip of conductive material disposed on the surface of the propagating material and extending along the direction of the central axis 17. The bus bar 23 terminates in a connection pad 24 to which electrical connection can be made.

The electrodes 15 of the third set are connected at the ends lying on the one side of the central axis 17 to a third bus bar 25 and at the ends disposed on the other side of the central axis 17 to a fourth bus bar 26. The third and fourth bus bars 25 and 26 are connected by paths of conductive material to a connection pad 27 to which electrical connection can be made.

Isolating cross-overs 30 are provided where electrodes and bus bars of the three sets would otherwise intersect. Conventional multilayer techniques are employed in forming the electrodes, bus bars, and cross-overs on the surface of the propagating medium.

The transducer 11 as shown and described is a balanced structure. The third set of electrodes 15, their associated bus bars 25 and 26, connection pad 27 and connecting paths thereto are symmetrical with respect to the central axis 17. Each of the electrodes of a set are of the same length. Portions of the electrodes of the first and second sets overlap to define the aperture of the transducer. The width of each electrode and the spacing between adjacent electrodes is one-sixth of the wavelength of the center frequency of the device. In order for the device to provide the appropriate frequency response when designed for operation as a filter the input transducer can be appropriately weighted by so-called electrode withdrawal technique. That is, certain of the electrodes are removed in a predetermined pattern to alter the acoustic surface waves generated by the input transducer in response to an input signal. However, it should be considered that essentially the input transducer employs three sets of interdigitated electrodes arranged in a periodic pattern on the surface of the substrate of propagating material.

Figure 2:
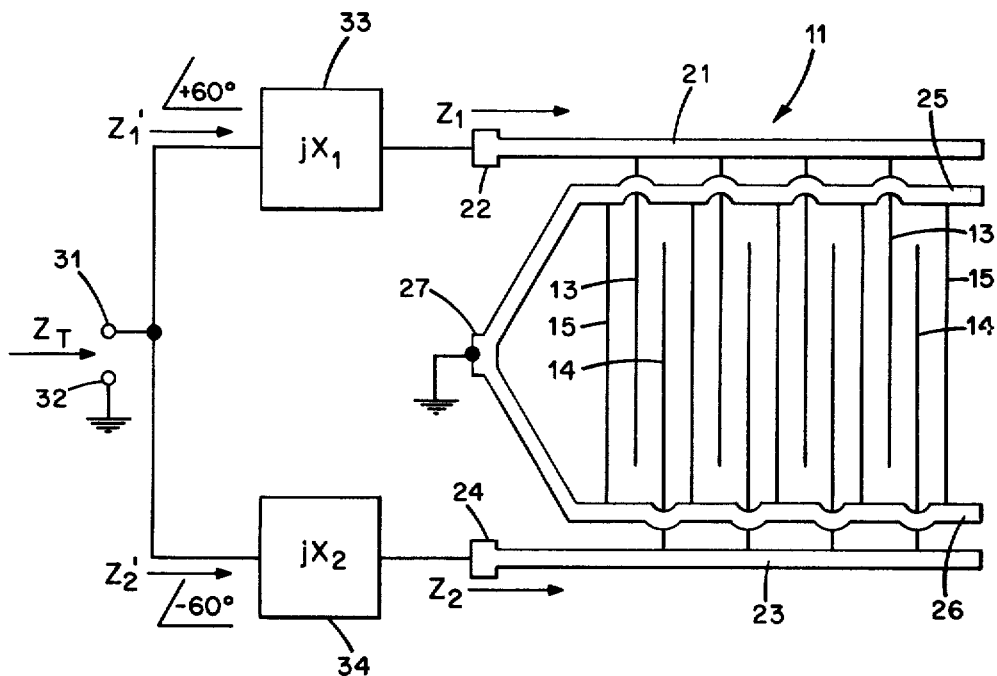
FIG. 2 is a schematic diagram of a transducer of the device of FIG. 1 with impedance-matching and phase-shifting networks connected thereto.

FIG. 2 is a diagram including a transducer as illustrated in FIG. 1, specifically for purposes of discussion the input transducer 11, together with electrical components and connections thereto to provide properly balanced three-phase operation from a single phase source. The input signal from a single phase source is applied to a pair of input terminals 31 and 32. Terminal 32 is connected to ground. Input terminal 31 is connected through a first impedance-matching and phase-shifting network 33 to the connection pad 22 of the first set of electrodes 13. Input terminal 31 is also connected through a second impedance-matching and phase-shifting network 34 to the connection pad 24 for the second set of electrodes 14. Connection pad 27 for the third set of electrodes 15 is connected to ground.

The reactance of the first network 33 is designated $jX_1$, and the reactance of the second network 34 is designated $jX_2$. The impedance looking into the connection pad 22 of the first set of electrodes 13 is is $Z_1$, and the impedance looking into the connection pad 24 of the second set of electrodes 14 is $Z_2$. The impedance seen looking into the first network 33 is $Z_1'$ and that looking into the second network 34 is $Z_2'$. The resulting impedance looking into the input terminal 31 is designated $Z_T$.

The four bus bar configuration makes it possible to operate the three-phase transducer as a balanced two-electrical port device which can be driven from a conventional single phase source, with simple matching networks 33 and 34 that provide both the phase shifting and the electrical matching required for minimum insertion loss. The impedances with respect to ground of the two ungrounded bus bars 21 and 23 of the transducer can be written, respectively, as $$Z_1 = A_1 \angle \phi_1 = A_1 \cos \phi_1 + j A_1 \sin \phi_1 \tag{1}$$

and $$Z_2 = A_2 \angle \phi_2 = A_2 \cos \phi_2 + j A_2 \sin \phi_2 \tag{2}$$

When reactances $x_1$ and $x_2$ are separately connected to the two ungrounded bus bars and then connected together to the single-phase source at the input terminal 31, the impedances of these two branches become $$Z_1' = A_1' \angle \phi_1' = A_1 \cos \phi_1 + j A_1 \sin \phi_1 + jx_1 \tag{3}$$

and $$Z_2' = A_2' \angle \phi_2' = A_2 \cos \phi_2 + j A_2 \sin \phi_2 + jx_2 \tag{4}$$

Equations (3) and (4) can be solved easily for $x_1$ and $x_2$ for a phase angle of 120° between the two branches, which is a necessary condition of the three-phase signal, that is $$\phi_1' - \phi_2' = 120° \tag{5}$$

Since the single-phase source can be assumed to have a phase angle of 180°, by choosing the phase angles $\phi_1' = 60°$ and $\phi_2' = -60°$, the single-phase source is converted into a three-phase source for the three-phase unidirectional transducer; thus $$A_1' \angle 60° = A_1 \cos \phi_1 + j A_1 \sin \phi_1 + jx_1 \tag{6}$$

and $$A_2' \angle -60° = A_2 \cos \phi_2 + j A_2 \sin \phi_2 + jx_2 \tag{7}$$

The real and imaginary parts of Equations (6) and (7) can be separated as follows:

$$A_1' \cos 60° = A_1 \cos \phi_1$$
$$A_1' \sin 60° = A_1 \sin \phi_1 + x_1 \tag{8}$$

and $$A_2' \cos 60° = A_2 \cos \phi_2$$
$$A_2' \sin 60° = -A_2 \sin \phi_2 - x_2 \tag{9}$$

Equation (8) leads to $$\tan 60° = \sqrt{3} = \frac{A_1 \sin \phi_1 + x_1}{A_1 \cos \phi_1} \tag{10}$$

Solving for $x_1$ $$x_1 = A_1(\sqrt{3} \cos\phi_1 - \sin\phi_1) = 2A_1 \sin(\phi_1 + 120°) \tag{11}$$

$x_1$ will always be positive (inductive) since $\phi_1$ will always be between 0 and −90 degrees.

Similarly, from Equation (9) $x_2$ is obtained as $$x_2 = -A_2(\sqrt{3} \cos\phi_2 + \sin\phi_2) = 2A_2 \sin(\phi_2 - 120°) \tag{12}$$

$x_2$ will be positive (inductive) for phase angles $-90° \leq \phi_2 < -60°$, zero for $\phi_2 = -60°$, and negative (capacitive) for $-60° < \phi_2 \leq 0°$. Thus, transducer tuning and matching require two inductors for phase angles less than −60°, one inductor and one capacitor for angles greater than −60°, and only one inductor for the special case where the phase angle is −60°.

The magnitude of the impedances of the two branches can also be solved and expressed as $$A_1' = [(A_1 \cos \phi_1)^2 + (A_1 \sin \phi_1 + x_1)^2]^{\frac{1}{2}} = 2A_1 \cos \phi_1 \tag{13}$$

and $$A_2' = [(A_2 \cos \phi_2)^2 + (A_2 \sin \phi_2 + x_2)^2]^{\frac{1}{2}} = 2A_2 \cos \phi_2 \tag{14}$$

The total impedance of the impedance matching and phase shifting networks and the transducer is $$Z_T = \frac{Z_1 Z_2}{Z_1 + Z_2} = \frac{A_1 A_2}{(A_1' + A_2')\cos 60° + j(A_1' - A_2')\sin 60°} \quad (15)$$

For a balanced three-phase unidirectional transducer the magnitudes and phase angles of the impedances from the two bus bars relative to ground can be written as $$A_1 = A_2 = A$$

$$\phi_1 = \phi_2 = \phi \quad (16)$$

Substituting these relations into the expressions of $A_1'$ and $A_2'$ and then into Equation (15) gives $$Z_T = \frac{4A^2 \cos^2 \phi}{4A\cos\phi \cos 60°} = 2A\cos\phi \quad (17)$$

The total input impedance of the balanced three-phase unidirectional transducer is therefore purely resistive and can be matched for minimum insertion loss to any resistive source or load by appropriate dimensioning of the transducer aperture.

In one specific embodiment of an acoustic surface wave filter device in accordance with the foregoing discussion two similar three-phase unidirectional transducers were fabricated or a yz lithium niobate substrate. Each transducer had 28 electrodes. There were nine electrodes in the first and second sets 13 and 14 and ten electrodes in the third set 15. The impedances of the source connected to the input transducer and of the load connected to the output transducer were 50 ohms. The center frequency of the filter was 100 Mhz. The first impedance-matching and phase-shifting network 33 had an inductance of approximately 0.3 microhenries and the second network 34 had a capacitance of approximately 50 picofarads. The insertion loss of the filter and the impedance-matching and phase-shifting components was 3.3 dB. The passband ripple was approximately 0.1 dB.

While there has been shown and described what is considered a preferred embodiment of the present invention, it will be obvious to those skilled in the art that various changes and modifications may be made therein without departing from the invention as defined by the appended claims.

What is claimed is:

1. An acoustic surface wave device including an acoustic surface wave propagating medium and a transducer on a surface of said medium, said transducer comprising:

first, second, and third sets of interdigitated electrodes of conductive material on the surface of the acoustic surface wave propagating medium with the electrodes extending transversely to the central axis of the transducer;

a first bus bar of conductive material on one side of the central axis extending generally along the direction of the central axis and connected to the end of each electrode of the first set on the one side of the central axis;

a second bus bar of conductive material on the other side of the central axis extending generally along the direction of the central axis and connected to the end of each electrode of the second set on the other side of the central axis;

a third bus bar of conductive material on the one side of the central axis extending generally along the direction of the central axis and connected to the end of each electrode of the third set on the one side of the central axis;

a fourth bus bar of conductive material on the other side of the central axis extending generally along the direction of the central axis and connected to the end of each electrode of the third set on the other side of the central axis;

the electrodes of each set and the bus bars connected thereto being electrically isolated from the electrodes of the other sets and the bus bars connected thereto.

2. An acoustic surface wave device in accordance with claim 1 including:

a first connection pad of conductive material on the surface of the acoustic surface wave propagating medium and connected to the first bus bar for providing means for making electrical connection to the first bus bar;

a second connection pad of conductive material on the surface of the acoustic surface wave propagating medium and connected to the second bus bar for providing means for making electrical connection to the second bus bar; and a third connection pad of conductive material on the surface of the acoustic surface wave propagating medium and connected to the third and fourth bus bars for providing means for making electrical connection to the third and fourth bus bars.

3. An acoustic surface wave device in accordance with claim 2 wherein:

the third connection pad is located along the central axis;

and including a path of conductive material between the third connection pad and the third bus bar; and a path of conductive material between the third connection pad and the fourth bus bar;

the combination of the third set of electrodes, the third bus bar, the fourth bus bar, the third connection pad, and said paths of conductive material being symmetrical about the central axis.

4. An acoustic surface wave device in accordance with claim 3 wherein:

the interdigitated electrodes of the first and second sets overlap for portions of their length;

the electrodes of the third set extend beyond the overlapping portions of the electrodes of the first and second sets on both sides of the central axis.

5. An acoustic surface wave device in accordance with claim 4 wherein:

each of the electrodes of the first set is of the same length;

each of the electrodes of the second set is of the same length; and each of the electrodes of the third set is of the same length.

6. An acoustic surface wave device in accordance with claim 5 wherein:

each of the electrodes is of the same width; and the space between each electrode and the adjacent electrode is equal to the width of an electrode;

the sum of the widths of three electrodes and three spaces is equal to the wavelength of acoustic surface waves at the center frequency of the transducer.

7. In combination
an acoustic surface wave device in accordance with claim 3;
a terminal;
a first reactance connected between the terminal and the first connection pad for producing a first impedance as seen from the terminal looking into the first reactance, which first impedance has a phase angle of +60° at the center frequency of the transducer;
a second reactance connected between the terminal and the second connection pad for producing a second impedance as seen from the terminal looking into the second reactance, which second reactance has a phase angle of −60° at the center frequency of the transducer;
whereby the phase difference between the first and second impedances is 120° and consequently the phase difference between signals at the first and second sets of electrodes is 120°.

8. In combination
an acoustic surface wave device in accordance with claim 3;
a terminal;
a first reactance $X_1 = 2A \sin(\phi + 120°)$ connected between the terminal and the first connection pad;
a second reactance $X_2 = 2A \sin(\phi - 120°)$ connected between the terminal and the second connection pad;
the third connection pad being connected to ground; wherein $\phi$ is the phase angle of the impedance at the first connection pad or at the second connection pad at the center frequency of the transducer whereby the total impedance presented at the terminal is substantially purely resistive.

9. The combination in accordance with claim 8 wherein:
the first reactance is an inductive reactance; and
the second reactance is an inductive reactance for a phase angle $\phi$ less than −60°, a capacitive reactance for a phase angle $\phi$ greater than −60°, and a direct connection between the terminal and the second connection pad for a phase angle $\phi$ of −60°.

* * * * *